United States Patent [19]

Callan

[11] 4,079,313

[45] Mar. 14, 1978

[54] DIGITAL WATTS TRANSDUCER

[75] Inventor: John E. Callan, Milwaukee, Wis.

[73] Assignee: Allen-Bradley Company, Milwaukee, Wis.

[21] Appl. No.: 788,111

[22] Filed: Apr. 18, 1977

[51] Int. Cl.² .............................................. G01R 21/00
[52] U.S. Cl. .................................................... 324/142
[58] Field of Search ................... 324/142; 235/151.21, 235/151.3, 151.31, 194

[56] References Cited

U.S. PATENT DOCUMENTS

| 3,470,471 | 9/1969 | Moore ................................... | 324/142 |
| 3,794,917 | 2/1974 | Martin et al. ......................... | 324/142 |
| 3,976,941 | 3/1976 | Milkovic ............................... | 324/142 |

Primary Examiner—Stanley T. Krawczewicz
Attorney, Agent, or Firm—Quarles & Brady

[57] ABSTRACT

A circuit for sensing instantaneous current and voltage generates a digital output which indicates the power consumed over a time interval. The analog product of sensed current and voltage is converted to a pulse train in which each pulse represents a plus or minus increment of power. These pulses are either added to or subtracted from a total accumulated power number which is stored in a digital counter. The contents of the digital counter is coupled to a display to provide a readout of total consumed power.

5 Claims, 8 Drawing Figures

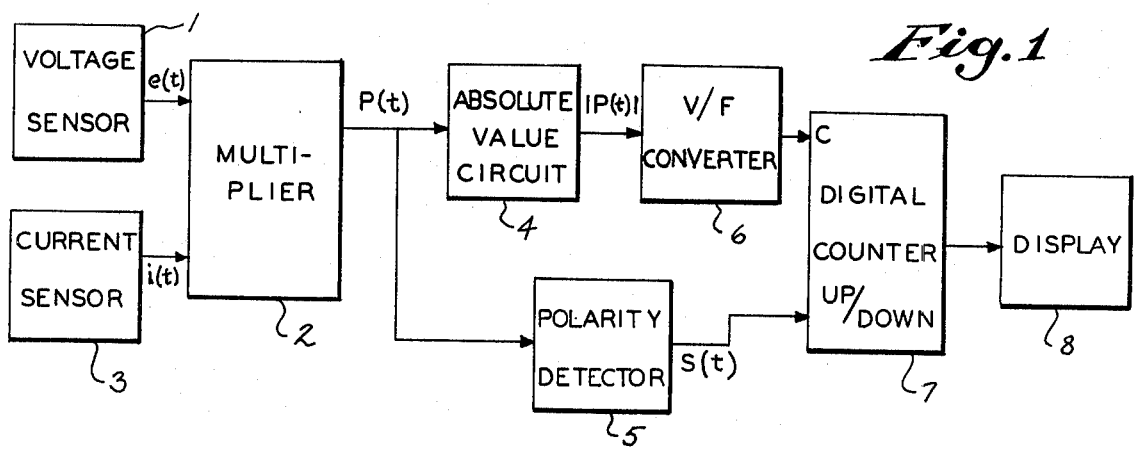
Fig.1
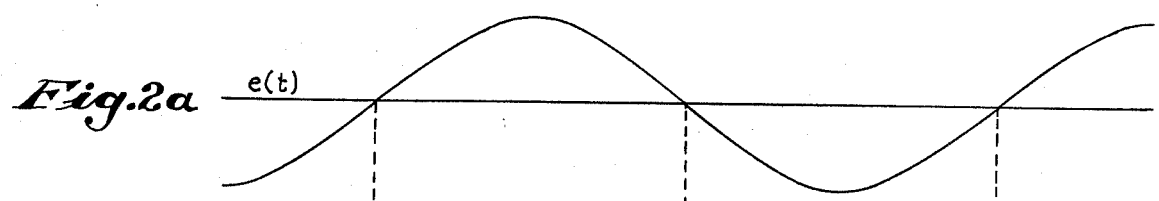
Fig.2a  e(t)
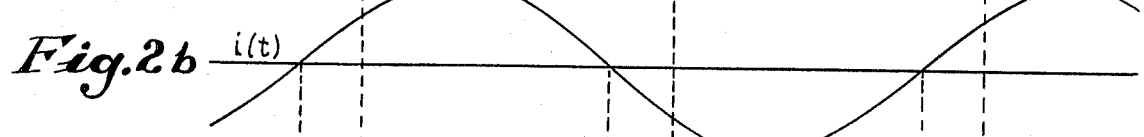
Fig.2b  i(t)
Fig.2c  P(t)
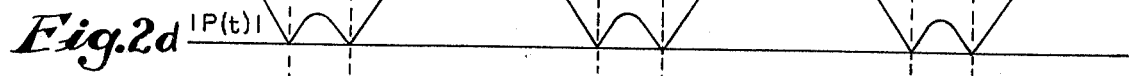
Fig.2d  |P(t)|
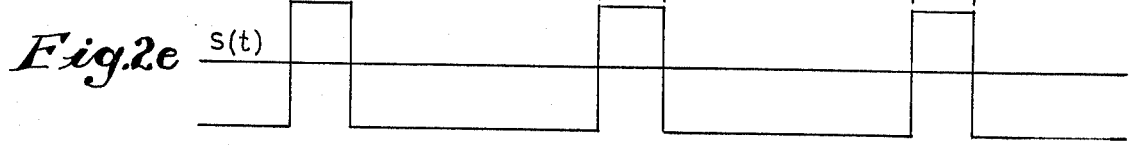
Fig.2e  S(t)

DIGITAL WATTS TRANSDUCER

BACKGROUND OF THE INVENTION

The field of the invention is wattmeters and watt-hour meters, and more specifically, watt-hour meters constructed from solid state electronic components.

There are a number of known wattmeters and watt-hour meters constructed of solid state electronic components. Such meters sense the magnitude of the voltage (E) and the magnitude of the current (I) and multiply them together to provide a signal proportional to their product (EI). Typically, however, the power factor (cos θ) is not taken into consideration in such meters and is instead assumed to be one. Such is often not the case, particularly in industrial environments where large numbers of reactive load devices are employed. The accuracy of these prior meters thus leaves much to be desired.

A watts transducer constructed of solid state devices which does take into consideration the power factor is disclosed in U.S. Pat. No. 3,794,917.

SUMMARY OF THE INVENTION

The present invention relates to a watt-second transducer in which the product of the sensed voltage and sensed current is converted to a pulse train in which the pulse rate is proportional to the absolute value of the product, the pulse train is applied to the input of a digital counter and the counter is counted either up or down depending on the sign of the voltage-current product.

The present invention is a watt-second transducer circuit which generates a digital number in the counter that indicates total energy consumed. Total energy (E) is defined as follows:

$$E = \int_0^T e(t)i(t)dt$$

where:

$e(t)$ = instantaneous value of sensed voltage,
$i(t)$ = instantaneous value of sensed current,
and $T$ = time interval during which power is measured.

If the current and voltage are in phase (power factor = 1) their product, $e(t)i(t)$, will always be positive and the above equation is solved by calculating the area under the curve $P(t) = e(t) i(t)$. When current and voltage are not in phase, however, the product $P(t)$ will be negative during part of the cycle. The above equation is then solved by subtracting the area under the negative part of the curve $P(t)$ from the area under the positive part of the curve $P(t)$.

A general object of the present invention is to provide a reliable transducer which will generate an accurate indication of the energy consumed during a time period. The circuit of the present invention measures active power consumed during a time interval as defined by the above equation, and it thus takes into consideration the power factor. The circuit is constructed primarily of solid state components which are relatively inexpensive and highly reliable.

Another object of the invention is to provide a digital readout of the total power consumed. The total power is stored as a digital number in a counter and this can be decoded and coupled directly to a visual display.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention and reference is made to the claims herein for interpreting the breadth of the invention.

BRIEF DESCRIPTION OF THE DRAWINGS

FIG. 1 is a block diagram of the watt-second transducer of the present invention, FIGS. 2a-e are waveforms which appear at various points in the watt-second transducer of FIG. 1, and FIGS. 3 and 4 are electrical circuit diagrams of the watt-second transducer of FIG. 1.

DESCRIPTION OF THE PREFERRED EMBODIMENT

Figure 3:
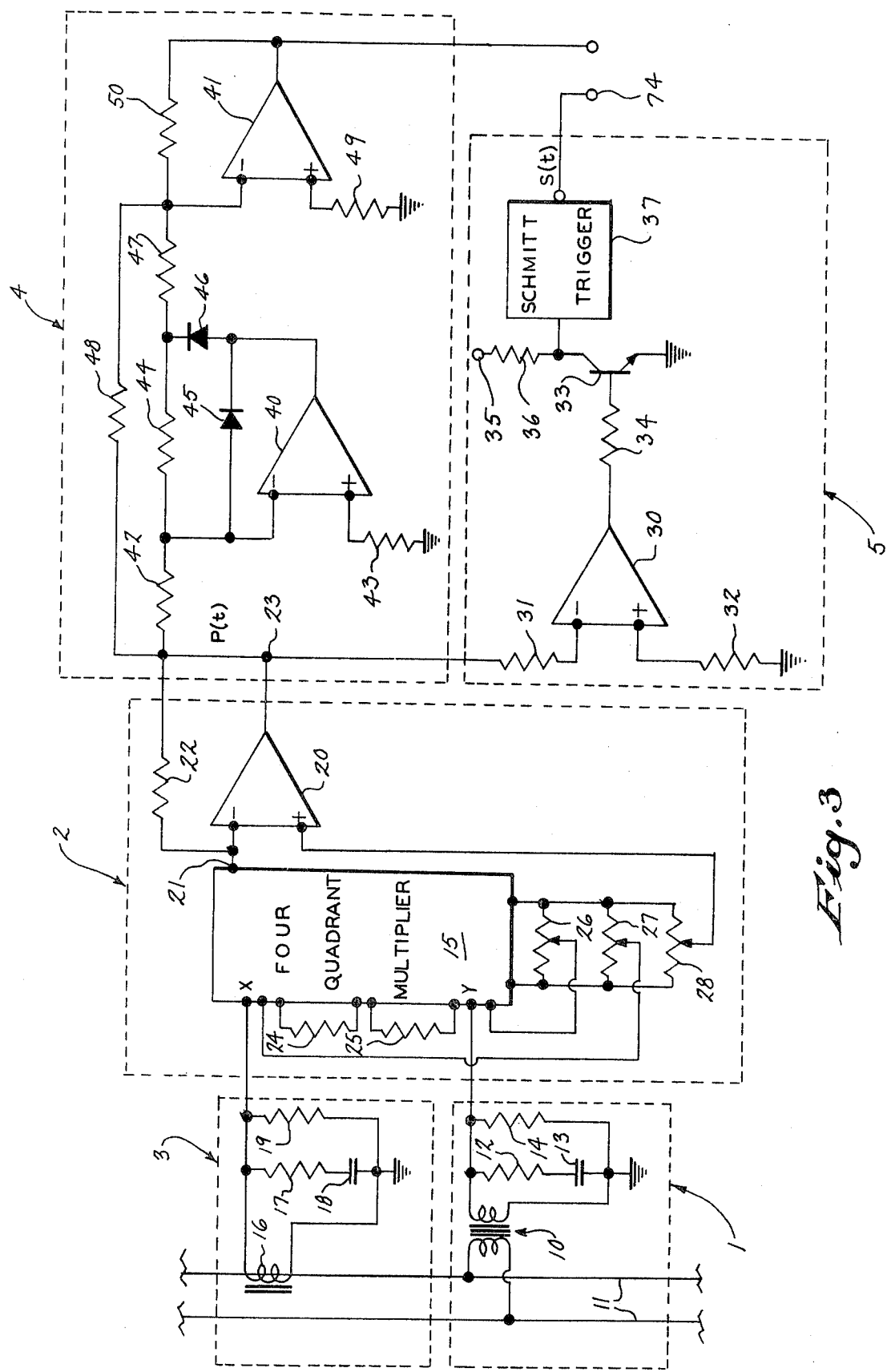

Referring to FIGS. 1 and 2, the transducer of the present invention includes a voltage sensor 1 which couples to the power lines and generates an analog signal $e(t)$ to one input of a multiplier 2. A current sensor 3 also connects to the power and generates and analog signal $i(t)$ to a second input on the multiplier 2. The signal $e(t)$ is proportional to the instantaneous value of the voltage across the power lines and such signal is illustrated by the sine wave in FIG. 2a. The signal $i(t)$ is proportional to the instantaneous value of the current flowing in the power lines and it is illustrated by the sine wave in FIG. 2b. The multiplier 2 generates an analog signal at its output which is proportional to the product, $P(t)$, of the two applied input signals $e(t)$ and $i(t)$. This output signal $P(t)$ is illustrated by the sine wave in FIG. 2c and it is applied both to the input of an absolute value circuit 4 and to the input of a polarity detector 5. The absolute value circuit 4 full-wave rectifies the applied signal $P(t)$ to invert any negataive portions thereof. The resulting signal $[P(t)]$ is illustrated by the waveform in FIG. 2d and it is applied to the input of a voltage-to-frequency (V/F) converter 6. The polarity detector 5 is a high gain amplifier whose output saturates at a logic high voltage when the applied waveform $P(t)$ is negative, and saturates at a logic low voltage when the applied waveform $P(t)$ is positive. This resulting waveform $S(t)$ is applied to the up/down terminal of a digital counter 7.

The voltage-to-frequency converter 6 generates a pulse train to the clock terminal of the digital counter 7. The rate at which such pulses are generated is directly proportional to the amplitude of the applied analog signal $[P(t)]$. Each pulse clocks the digital counter 7 and the digital number stored in the counter is either incremented or decremented one count depending on the polarity of the signal $S(t)$ applied to the counter up/down terminal. The stored count is incremented by a received pulse when the signal $S(t)$ is negative and the count is decremented by a received pulse when the signal $S(t)$ is positive. Each pulse generated by the V/F converter 6 represents an increment of area under the curve defined by the singal $[P(t)]$. The total count in the digital counter 7 is the sum of the pulses which are generated when the product signal $P(t)$ is positive minus the total number of pulses which are generated when the signal $P(t)$ is negative. The digital number in the counter 7 thus represents the net positive area beneath the curve P(t) and is proportional to the total consumed energy. This number is coupled to a display 8 which provides a visual indication of the power which has been consumed.

A more detailed description of the above described elements of the invented transducer will now be made with reference to FIGS. 3 and 4. Referring particularly to FIG. 3, the voltage sensor 3 includes a transformer 10 which has its primary winding connected across power lines 11 and a secondary winding which has one terminal connected to signal ground. A parasitic suppression network comprised of a resistor 12 and capacitor 13 are connected across the secondary winding of the transformer 10, a bias resistor 14 is connected in parallel with the parasitic suppression network, and the free lead on the secondary winding of the transformer 10 connects to a Y input on a four-quadrant multiplier 15 which forms part of the multiplier circuit 2.

The current sensor 3 includes a current transformer 16 having a secondary winding which is magnetically coupled to one of the power lines 11. One terminal on the winding of the transformer 16 connects to signal ground and its other terminal connects to an X input on the four-quadrant multiplier 15. A parasitic suppression network comprised of resistor 17 and capacitor 18 is connected across the current transformer secondary winding 16 and a bias resistor 19 is connected in parallel therewith.

The main elements of the multiplier circuit 2 are the four-quadrant multiplier 15 and an operational amplifier 20. The four-quadrant multiplier 15 generates a current at an output terminal 21 which is proportional in magnitude to the product of the voltages applied to the X and Y inputs. This output terminal 21 conncts to the inverting input on the operational amplifier 20 and through a feedback resistor 22 to the output of the amplifier 20. The operational amplifier 20 serves as a current-to-voltage converter, and it generates an analog voltage at its output 23 which is proportional to the magnitude of the product of the voltages applied at the X and Y inputs of the four-quadrant multiplier 15.

The voltage gain of the multiplier 2 is determined in part by a pair of resistors 24 and 25 which are connected to terminals on the four-quadrant multiplier 15 and in part by the feedback resistor 22. The voltage at the operational amplifer output terminal 23 is given by the following expression:

$$P(t) = \frac{2R_{22}e(t)i(t)}{R_{24}R_{25}(.5 \times 10 - 3)} = K[e(t)i(t)]$$

where: $K$ = scale factor = 1/10 in the preferred embodiment

Three potentiometers 26, 27 and 28 connect to the four-quadrant multiplier 15 to provide offset adjustments for the X and Y inputs and the output 21. The wiper on the potentiometer 28 connects to the non-inverting input on the operational amplifier 20 and it is adjusted to provide zero voltage output at the terminal 23 when zero voltage is applied to both the X and Y inputs. The wiper on potentiometer 27 is adjusted to provide zero current at output terminal 21 when zero voltage is applied to the X input and a 5- volt peak-to-peak sine wave is applied to the Y input. The wiper on the potentiometer 26 is adjusted to provide zero current at the output terminal 21 when zero voltage is applied to the Y input and a 5-volt peak-to-peak sine wave is applied to the X input.

The four-quadrant multiplier 15 is an integrated circuit such as the Model MC1594L commercially availabel from Motorola, Inc. For a more detailed description of this device and the multiplier 2, reference is made to the *The Semi-Conductor Data Library*, Series A, Volume VI, published by Motorola, Inc. in 1975.

Referring to FIG. 3, the polarity detector 5 includes an operational amplifier 30 having its inverting input coupled through a resistor 31 to the output 23 of the multiplier operational amplifier 20. The non-inverting input on the operational amplifier 30 connects to signal ground through a resistor 32 and its output terminal connects to the base of an NPN transistor 33 through a resistor 34. The emitter of transistor 33 connects to signal ground and its collector connects to a positive d-c supply terminal 35 through a load resistor 36. The collector of transistor 33 also connects to an inverting Schmitt trigger 37.

Without feedback the voltage gain of the operational amplifier 30 is exceedingly high with the result that its output saturates at either the positive or negative supply terminal voltage depending on the polarity of the signal applied to its inverting input. The transistor 33 is driven by the operational amplifier 30 and is thus switched on and off in response to polarity changes in the waveform P(t) applied to the input of the operational amplifier 30. The transistor 33 drives the Schmitt trigger 37, which in addition to inverting the logic level applied to its input, serves to filter out momentary changes in logic state due to noise.

The absolute value circuit 4 includes a first operational amplifier 40 and a second operational amplifier 41. The inverting input on the first operational amplifier 40 connects to the multiplier output through a coupling resistor 42 and its noninverting input connects to signal ground through a resistor 43. A feedback network comprised of a resistor 44 and two diodes 45 and 46 connect the output of the operational amplifier 40 to its inverting input and the cathode of diode 46 connects through a coupling resistor 47 to the inverting input on the second operational amplifier 41 also connects to the output of the multiplier 2 through a coupling resistor 48 and its noninverting input connects to signal ground through a resistor 49. A feedback resistor 50 connects the output of the second operational amplifier 41 to its inverting input. The output of the amplifier 41 serves as the output of the absolute value circuit 4.

When the output waveform P(t) generated by the multiplier 2 is positive, the diode 45 in the feedback network of the first operational amplifier 40 is forward biased. As a result, the output of the first operational amplifier 40 is held at virtual ground and no signal is coupled through the coupling resistor 47. The positive portion of the waveform P(t) is coupled through the resistor 48 to the second operational amplifier 41 where it is inverted and generated at its output terminal. The values of the coupling resistor 48 and the feedback resistor 50 are identical so that unity gain is achieved during positive portions of the applied waveform P(t). When the output waveform P(t) of the multiplier 2 goes negative, however, the diode 45 in the feedback network for the first operational amplifier 40 becomes reverse biased and the feedback resistor 44 becomes effective. the values of the coupling resistor 42 and the feedback resistor 44 are identical and the gain of the first operational amplifier 40 is, therefore, unity. The signal appearing at the cathode of diode 46 is an inversion of the input signal P(t) and it is applied to the second operational amplifier 41 through the coupling resistor 47. The value of coupling resistor 47 is one-half that of the feedback resistor 50, and as a consequence, when summed at the inverting input of amplifier 41 with the signal of opposite polarity coupled directly through the resistor 48, it predominates. The net result is that the negative going portions of the applid waveform P(t) appear at the output of the second operational amplifier 41 with the same polarity and magnitude. The applied waveform P(t) is effectively full-wave rectified without the creation of any "deadband" around zero volts which might otherwise occur if a bridge rectifier circuit were employed.

Figure 4:
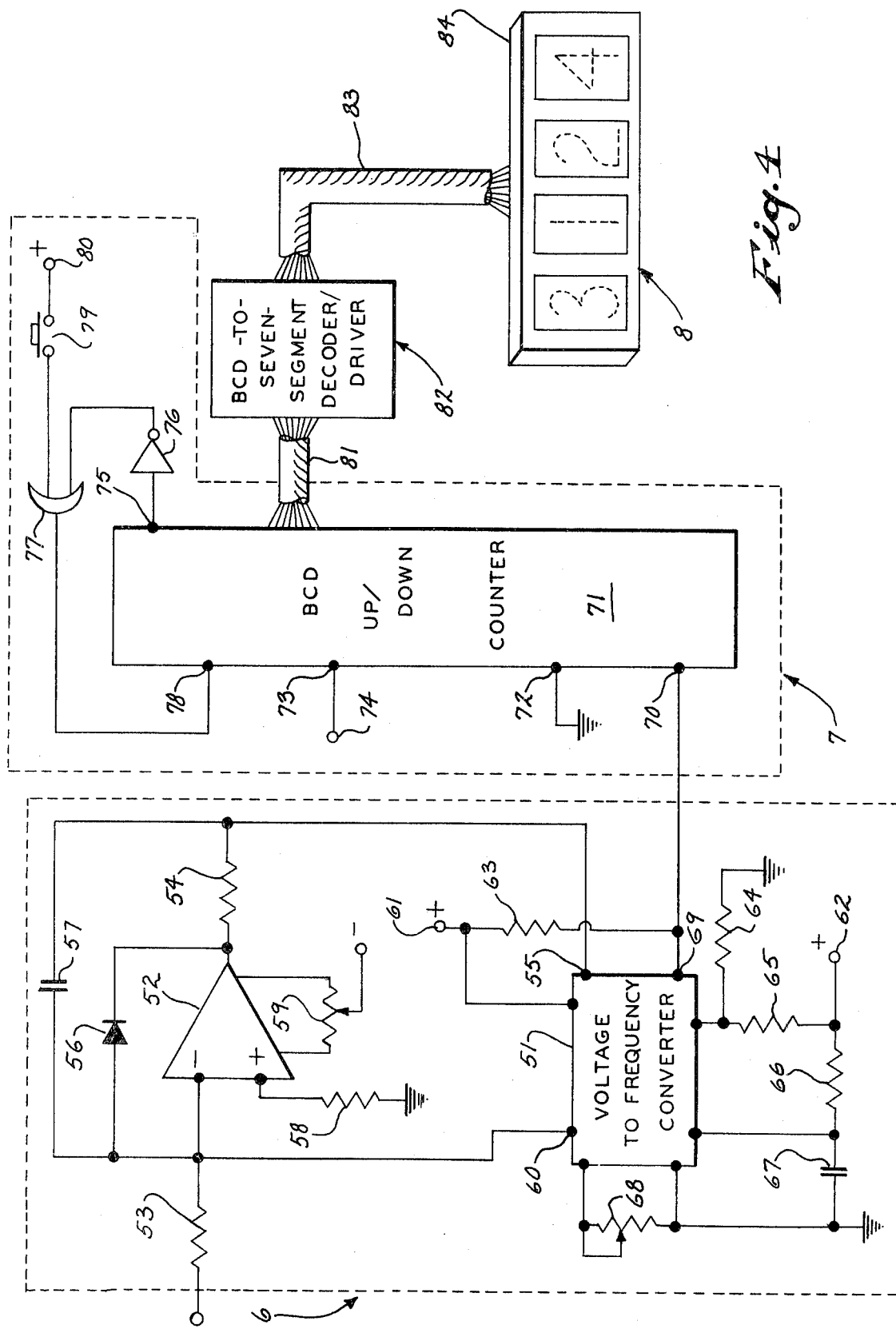

Referring to FIG. 4, the V/F converter 6 is a precision voltage-to-frequency converter which includes a voltage-to-frequency converter (VFC) circuit 51 and an operational amplifier 52. The VFC 51 is an integrated circuit such as the model RM4151 commercially available from Raytheon Semiconductor and the Operational amplifier is a model RC4131 also commercially available from Raytheon Semiconductor. The signal [P(t)] from the absolute value circuit 4 is applied to inputs on the VFC 51 and operational amplifier 52 through a coupling resistor 53. The output of the operational amplifier 52 couples through a resistor 54 to a second input 55 on the VFC and a feedback circuit comprised of diode 56 and capacitor 57 connect it to the inverting input of the amplifier 52. The non-inverting input on the operational amplifier 52 connects to signal ground through a resistor 58 and an offset adjust potentiometer 59 connects to offset adjustment terminals on the amplifier 52. The operational amplifier circuit serves to integrate the applied waveform [P(t)] and to mantain input 60 on the VFC 51 at zero volts to improve linearity of the conversion.

The VFC 51 is connected to positive d-c supply terminals 61 and 62 and to signal ground through resistors 63–66 and a capacitor 67. A full scale trim potentiometer 68 also connects the VFC 51 to signal ground. An output terminal 69 on the VFC 51 serves as the output of the V/F converter 6 and it connects to a clock terminal 70 on the digital counter 7. The frequency ($f_o$) of the pulse train generated at the output terminal 69 is proportional to the amplitude of the voltage [P(t)] applied to coupling resistor 53 and is defined by the following equation:

$$f_o = K[P(t)] \text{ KHz}$$

The duration of each pulse is determined by the values of capacitor 67 and resistor 66 ($t = 1.1R_{66}C_{67}$). The potentiometer 68 is adjusted to provide a 10KHz output when [P(t)] has a value of −10 volts and the potentiometer 59 is adjusted to provide an output of 10Hz when [P(t)] has a value of −10 mV. For a more detailed description of the V/F converter 6 reference is made to RM4151 data sheet published by Raytheon Semiconductor.

The digital counter 7 includes a plurality of commercially available BCD up/down counters wich are interconnected to form a counter 71. Pulses from the V/F converter 6 are received at a common clock terminal 70 and a common up/down terminal 73 connects through a lead 74 to the output of the polarity detector 5. The counter 71 is comprised of four or more cascade connected four-bit counters such as the model MC14510B commercially available from Motorola Semiconductor, Inc. Their preset inputs are connected to signal ground and the "carry out" terminal 75 on the last four-bit counter couples through an inverter gate 76 and an OR gate 77 to the common preset enable terminal 78 on the counter 71. A reset pushbutton 79 connects a positive d-c supply terminal 80 to a second input on the OR gate 77, and when depressed, the counter 71 is preset to zero. It should be apparent that larger counters may be desirable in applications where the total power consumption is to be measured over long periods of time.

The sixteen most significant digit outputs on the counter 7 connect through a cable 81 to four BCD-to-seven-segment decoder/drive circuits 82. This circuit is comprised of four integrated circuits such as the model MC14511B which is commercially available from Motorola Semiconductor, Inc. The output terminals of each of the four integrated circuits through a cable 83 to the input circuit of a seven segment display circuit 84. Seven segment displays such as the model 5082-7730 which is commercially available from Hewlett-Packard Inc. can be employed, and it should be apparent that any number of these may be employed with a corresponding numner of decoder/drivers 82 to provide the desired resolution.

I claim:

1. A transducer for indicating the total power flowing through a set of power lines, the combination comprising:
    means for sensing the current flowing in said power lines and generating a signal whose amplitude is proportional thereto;
    means for sensing the voltage across said power lines and generating a signal whose amplitude is proportional thereto;
    multiplier means connected to receive at input terminals the signals generated by said current and voltage sensing means, said multiplier means being operable to generate an analog output signal whose magnitude is proportional to the product of the amplitude of the signals applied to its input terminals;
    polarity detector means having an input terminal connected to receive the analog output signal from said multiplier means and being operable to generate a digital output signal the polarity of which corresponds with the polarity of the analog signal applied to its input terminal;
    converter means having an input terminal coupled to receive the analog output signal from said multiplier means, said analog-to-digital converter means being operable to generate digital pulses at an output terminal at a rate which is proportional to the absolute magnitude of the analog signal applied to its input terminal; and
    a digital counter connected to the outputs of said polarity detector means and said analog-to-digital converter means, said digital counter being operable to store a number which represents the sum of the digital pulses generated by said analog-to-digital converter means when the output of said polarity detector means has one polarity minus the digital pulses generated by the analog-to-digital converter means when the output of said polarity detector means has the opposite polarity.

2. The transducer as recited in claim 1 in which said converter means includes an absolute value circuit which full-wave rectifies the analog output signal received from said multiplier means and a voltage to frequency converter circuit which generates said digital pulses in response to the magnitude of the full-wave rectified signal.

3. The transducer as recited in claim 1 in which display means is coupled to said digital counter and is operable to display said stored number in digital form.

4. A transducer for indicating the total power flowing through a set of power lines, the combination comprising:
- a current sensor connected to one of said power lines and being operable to generate a current signal $i(t)$ whose amplitude is proportional to the instantaneous amplitude of the current flowing in said one power line;
- a voltage sensor connected across a pair of said power lines and being operable to generate a voltage signal $e(t)$ whose amplitude is proportional to the instantaneous amplitude of the voltage across said pair of power lines;
- a multiplier connected to receive said current signal $i(t)$ and said voltage signal $e(t)$ and being operable to generate an analog output signal $P(t)$ which is proportional to the product of said current signal $i(t)$ and said voltage signal $e(t)$;
- a polarity detector circuit connected to receive the multiplier analog output signal $P(t)$ and generate digital output signal $S(t)$ which has one logic state when the analog output signal $P(t)$ is positive and the opposite logic state when the analog output signal $P(t)$ is negative;
- an absolute value circuit connected to receive the analog output signal $P(t)$ and being operable to full-wave rectify that signal to generate an analog output signal $[P(t)]$ of one polarity;
- an analog-to-frequency converter circuit connected to receive said analog output signal $[P(t)]$ and being operable to generate a digital pulse train, the frequency of which is proportional to the magnitude of the applied analog signal $[P(t)]$; and
- a digital up/down counter connected to receive at an input terminal the digital pulse train generated by said analog-to-frequency converter circuit and connected to receive at an up/down terminal the digital output signal $S(t)$ from said polarity detector circuit, said digital up/down counter being operative to accumulate and store as a digital number the total number of pulses received at its input terminal when the digital signal $S(t)$ applied to its up/down terminal is in one logic state and to subtract from said stored digital number the total number of pulses received at its input terminal when the digital signal $S(t)$ has the opposite polarity.

5. The transducer as recited in claim 4 in which a digital display connects to said digital up/down counter and displays a number which is representative of the digital number stored in said up/down counter.

* * * * *

UNITED STATES PATENT OFFICE
CERTIFICATE OF CORRECTION

Patent No. 4,079,313            Dated March 14, 1978

Inventor(s) John E. Callan

It is certified that error appears in the above-identified patent and that said Letters Patent are hereby corrected as shown below:

Column 2, line 27, change second "and" to -- an --.

Column 2, line 41, "negataive" should be -- negative --.

Column 3, line 48, "amplifer" should be -- amplifier --.

Column 4, line 7, delete first "the".

Column 4, line 43, "second operational amplifier 41 also connects to the output" should be -- second operational amplifier 41. The inverting input on the second operational amplifier 41 also connects to the output --.

Column 4, line 66, "the" should be -- The --.

Column 5, line 9, "applid" should be -- applied --.

Column 5, line 28, insert "51" after VFC.

Column 6, line 12, "counter 7" should be -- counter 71 --.

Column 6, line 13, "decoder/drive" should be -- decoder/driver --.

UNITED STATES PATENT OFFICE
CERTIFICATE OF CORRECTION

Patent No. 4,079,313      Dated March 14, 1978

Inventor(s) John E. Callan

It is certified that error appears in the above-identified patent and that said Letters Patent are hereby corrected as shown below:

Column 6, line 17, "circuits through" should be -- circuits connect through --.

Signed and Sealed this

Eighteenth Day of July 1978

[SEAL]

Attest:

RUTH C. MASON
*Attesting Officer*

DONALD W. BANNER
*Commissioner of Patents and Trademarks*